US006188264B1

(12) United States Patent
Masuta et al.

(10) Patent No.: US 6,188,264 B1
(45) Date of Patent: Feb. 13, 2001

(54) AUTOMATIC THRESHOLD LEVEL CONTROL CIRCUIT

(75) Inventors: Tomoaki Masuta, Tokyo; Akira Kakinoki, Kawasaki, both of (JP)

(73) Assignee: NEC Corporation, Tokyo (JP)

( * ) Notice: Under 35 U.S.C. 154(b), the term of this patent shall be extended for 0 days.

(21) Appl. No.: 09/443,047

(22) Filed: Nov. 18, 1999

(30) Foreign Application Priority Data

Nov. 19, 1998 (JP) ................................. 10-330044

(51) Int. Cl.[7] ....................................... H03K 5/08
(52) U.S. Cl. ..................... 327/316; 327/323; 327/63; 327/65; 327/67
(58) Field of Search .................. 327/63, 64, 65, 327/67, 309, 315, 316, 323, 68, 72

(56) References Cited

U.S. PATENT DOCUMENTS

| 5,028,815 | * | 7/1991 | Van De Plassche | 327/65 |
| 5,307,196 | * | 4/1994 | Kinoshita | 359/189 |
| 5,712,581 | * | 1/1998 | Kaylor | 327/74 |
| 6,041,084 | * | 3/2000 | Nagaraj | 375/317 |

FOREIGN PATENT DOCUMENTS

| 8-293838 | 11/1996 | (JP) . |
| 9-181687 | 7/1997 | (JP) . |
| 10-126349 | 5/1998 | (JP) . |
| 10-210088 | 8/1998 | (JP) . |

* cited by examiner

*Primary Examiner*—Timothy P. Callahan
*Assistant Examiner*—An T. Luu
(74) *Attorney, Agent, or Firm*—Young & Thompson

(57) ABSTRACT

An automatic threshold level control circuit is provided which is capable of controlling the threshold level without causing the DUTY deterioration.

The automatic threshold level control circuit comprises a timing detecting circuit 110a, used for preserving the peak voltage values of each input signals for input signals (ATCIN+ and ATCIN−) and for outputting the preserved voltage values as a reference signal for the threshold level of each input signal, and the automatic threshold level control circuit comprises a pair of peak value detecting circuits PD1 (62) and PD2 (64) for resetting the held voltage values into reference voltages $V_{ref1}$ and $V_{ref2}$ by reset signals PD1RST and PD1RST; and the timing detecting circuit 110a for detecting a predetermined timing and outputting the reset signals PD1RST and PD2RST to the peak value detecting circuits PD1 and PD2 for releasing the reset state in accordance with the detected timing.

4 Claims, 7 Drawing Sheets

AUTOMATIC THRESHOLD LEVEL CONTROL CIRCUIT

BACKGROUND OF THE INVENTION

1. Field of the Invention

The present invention relates to an automatic threshold level control circuit, which automatically changes an threshold level of an input signal in response to the dynamic change of the power level of the input signals.

2. Background Art

Conventionally, an automatic threshold level control circuit for automatically controlling the threshold level in response to the dynamic changes of the power level has been used in a receiver in a burst digital light signal transmission system such as full service access network transmission system. One example of this type of automatic threshold level control circuit is disclosed in Japanese Patent Application, First Publication No. Hei 10-126349 entitled "Burst Light Receiving Circuit".

FIG. 6 is a circuit diagram showing an example of a feed-forward-type conventional automatic threshold level control circuit for determining the threshold level in response to the input signal. In the feed-forward-type ATC (Automatic Threshold Level Control) circuit 600 shown in FIG. 6, two pulse signals, in which amplitudes of respective pulse signals switch between normal phase or negative phase, are input into terminals ATCIN+ and ATCIN−, respectively. The input terminal ATCIN+ is connected to a peak value detecting circuit PD2 (64) and a resistor 1, and the input terminal ATCIN− is connected to a peak value detecting circuit PD1 (62) and a resistor 3. The peak value detecting circuit PD1 (62) holds the peak level of the input signal in a capacitor $C_{pd1}$ and outputs the peak level. The peak value detecting circuit PD2 (64) resets the charged voltage of the capacitor $C_{pd1}$ to the reference voltage $V_{ref1}$ by turning on a MOS (Metal Oxide Semiconductor) transistor 63 connected to the capacitor $C_{pd1}$, when the reset signals input to a terminal RST changes high level. Similarly, the peak value detecting circuit PD2 (64) holds the peak level of the input signal and outputs it. When the reset signals input to a terminal RST changes high level, the MOS transistor 65 connected to the capacitor $C_{pd2}$ is turned on and the voltage of the capacitor $C_{pd2}$ is reset.

Here, a buffer amplifier 61 connected to the feed-forward-type ATC circuit 600 outputs to the positive phase output terminal ATCOUT+ a voltage amplified after dividing the input voltage in the input terminal ATCIN+ and the output voltage $V_{PD1}$ by the resistor R1 and the resistor R2 connected in series with the output of the peak value detecting circuit PD1 (62). The buffer amplifier 6 also outputs to the negative phase output terminal ATCOUT− a voltage amplified after dividing the input voltage to the input terminal ATCIN− and an output voltage $V_{PD2}$ of the peak value detecting circuit PD2 (64).

FIG. 7 is a waveform diagram showing time dependent changes of operating voltages of each portion of the feed-forward-type ATC circuit 600 shown in FIG. 6 and an output voltage of the buffer amplifier 61. For the circuit shown in FIG. 6, the same reset signals RST are input into both the peak value detecting circuit PD1 (62) and PD2 (64) in the guard time between the burst signals. Consequently, in an example shown in FIG. 7, since the peak detecting circuit PD1 (62) holds the level where there are no signals, a DUTY ratio degradation will be caused which corresponds to the change of the duty ratio of the output pulse signal from that of the input signal when the level of the input signal "0" differs from that of no signal level.

SUMMARY OF THE INVENTION

It is therefore an object of the present invention to provide an automatic threshold level control circuit, which is capable of controlling the threshold level of input signals without causing the DUTY deterioration.

According to the first aspect of the present invention, the automatic threshold level control circuit comprising: a pair of peak value detecting circuits for preserving the peak voltage values of each input signal for input signals changing in a mutually negative phase to each other, for outputting the held voltage value as the standard for the threshold level of each input signal, and for resetting the preserving voltage value to the predetermined reference voltage value by a reset signal; and a timing detecting circuit for detecting a timing according to the change of the input signal and for outputting the reset signal for releasing the reset state corresponding to the detected timing to said peak value detecting circuit.

According to the second aspect of the present invention, in the automatic threshold level control circuit, the timing detecting circuit outputs a reset signal for releasing the reset state in response to the timing when the input signal level changes.

According to the third aspect, in the automatic threshold level control circuit, the timing detecting circuit outputs a pair of reset signals for releasing the reset state to each peak value detecting circuit independently in response to the change of the edge of each input digital signal.

According to the fourth aspect, in the automatic threshold level control circuit, the timing detecting circuit comprises a comparator which operates by inputting an input signal and at least a pair of RS flip-flop circuits which operate according to the output of the comparator, and said timing detecting circuit detects a predetermined timing in response to the change of the input signal, temporarily holds the reset signal to be output by the RS flip-flop circuit, and releases the reset state by the output of the comparator. According to the above described structure, an automatic threshold level control circuit is provided which has a simple structure and which is suitable for high speed processing.

DETAILED DESCRIPTION OF THE INVENTION

Figure 1:
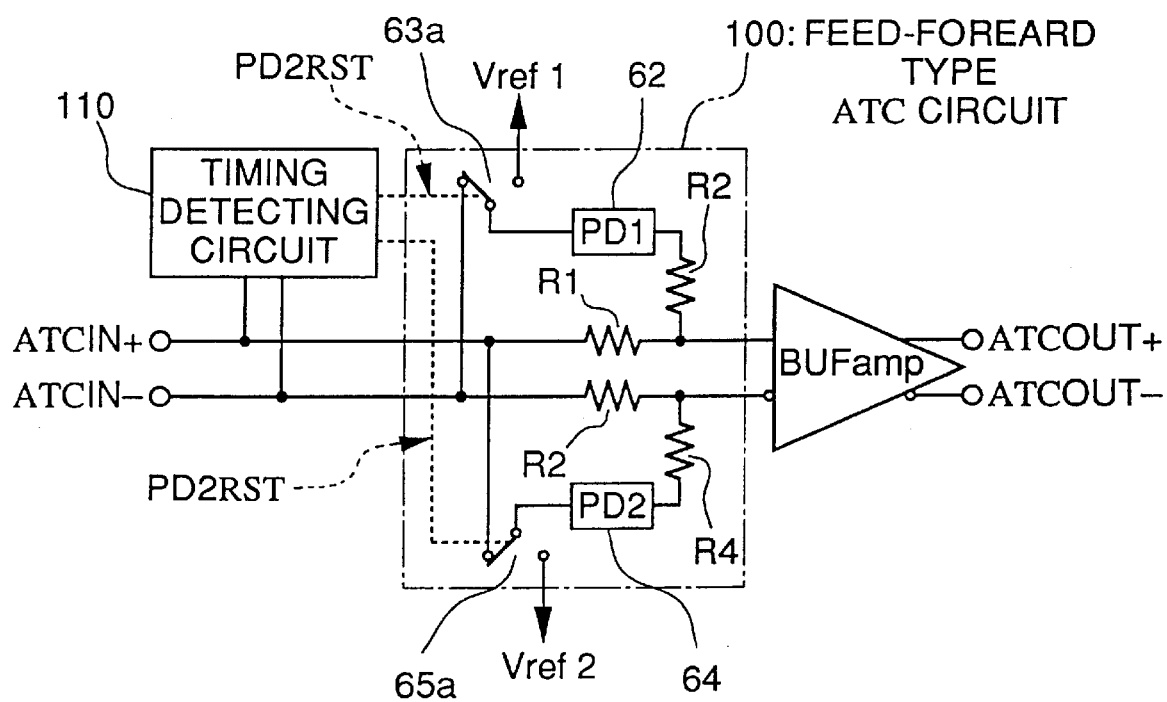
FIG. 1 is a circuit diagram showing the basic structure of an automatic threshold level control circuit of the present invention.
Figure 2:
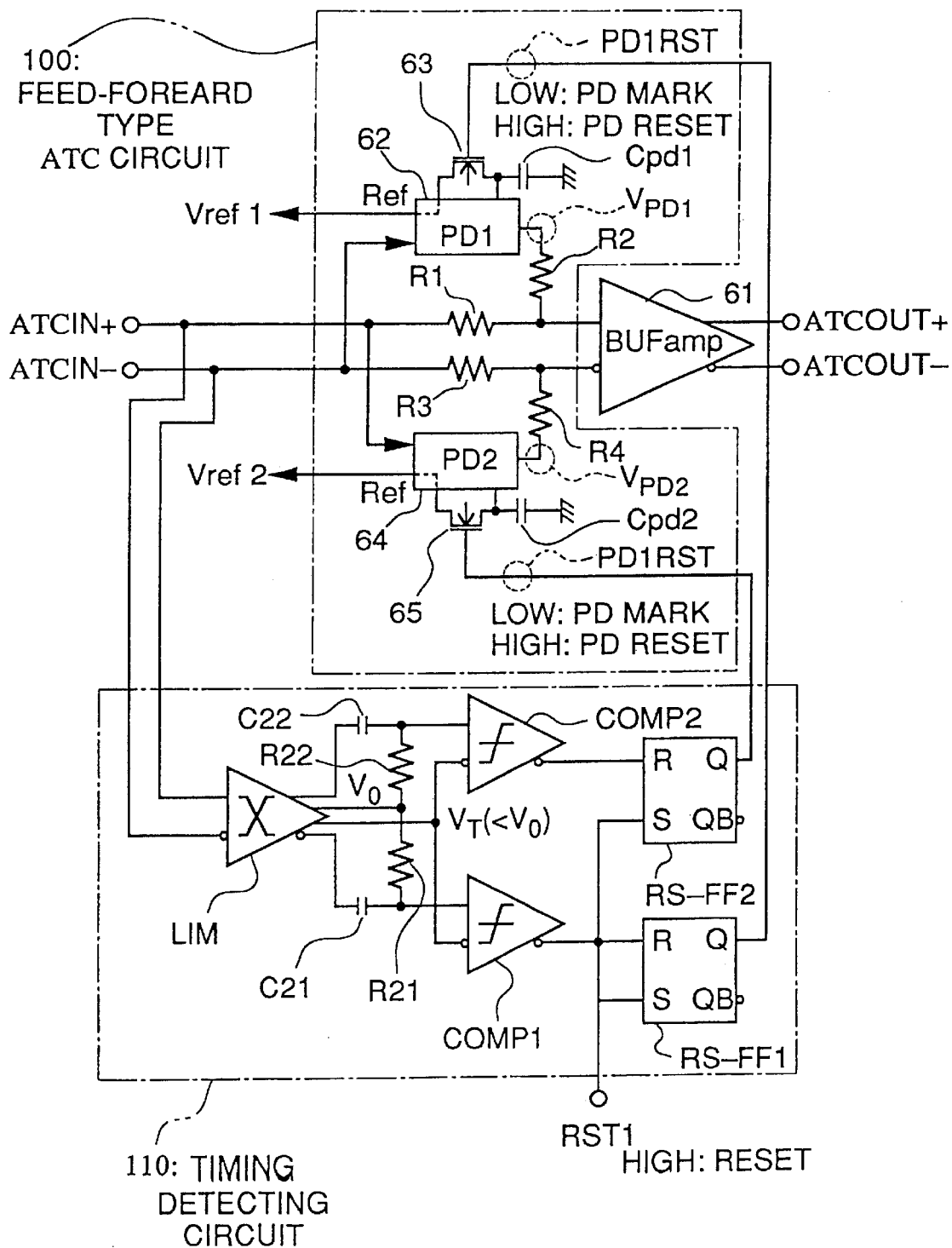
FIG. 2 is a circuit diagram showing the practical structure of the automatic threshold level control circuit shown in FIG. 1.

Hereinafter, an embodiment of the present invention will be described with reference to the attached drawings. FIG. 1 is a circuit diagram showing the basic structure of an automatic threshold level control circuit of the present invention. FIG. 2 is a circuit diagram showing the practical structure of the automatic threshold level control circuit shown in FIG. 1.

Figure 6:
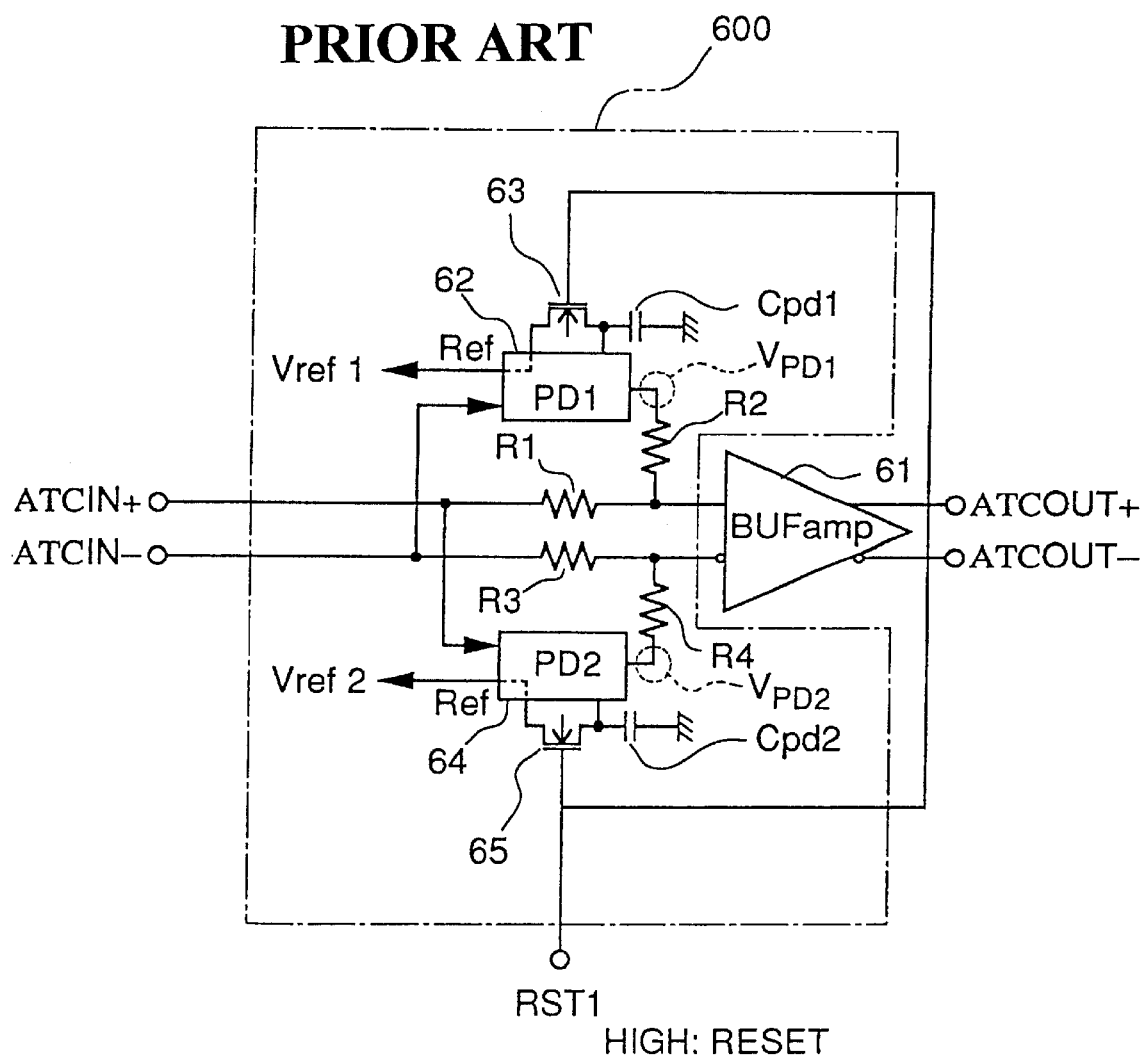
FIG. 6 is a circuit diagram showing the structure of a conventional automatic threshold level control circuit.
Figure 7:
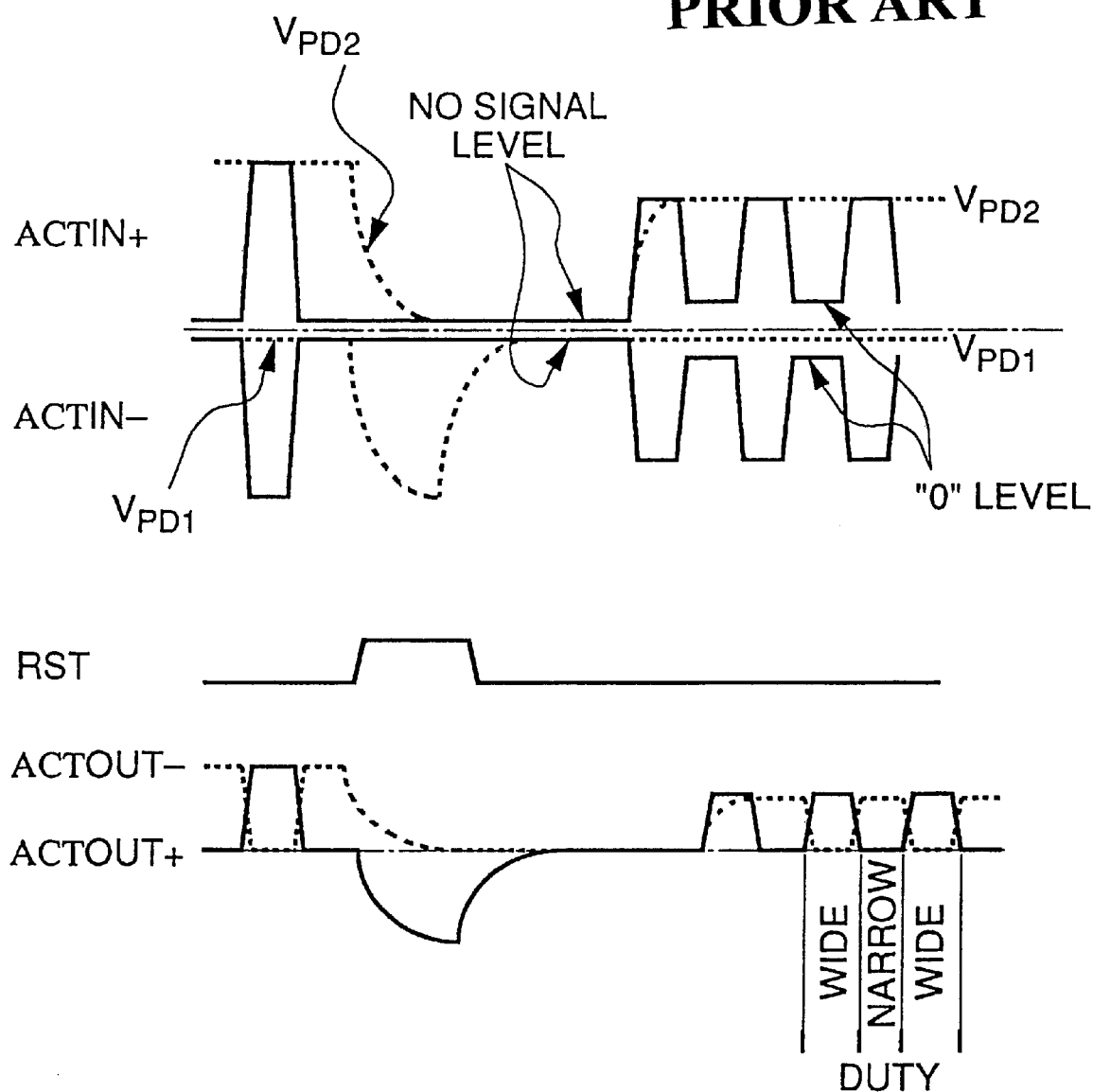
FIG. 7 is a timing chart showing operating waveforms of the circuit shown in FIG. 6.

The automatic threshold control circuit shown in FIG. 1 comprises a feed-forward-type ATC (Automatic threshold level control) circuit 100, and a timing detecting circuit for generating a reset signal which is input into the feed-forward-type ATC circuit 100 in response to signals input into terminals ATCIN+ and ATCIN−. In FIG. 1, the same components as those shown in FIG. 6 are denoted by the same numerals.

The feed-forward-type ATC circuit 100 shown in FIG. 1 differs from the conventional feed-forward-type ATC circuit in that the reset signals supplied to two peak value detecting circuits PD1 (62) and PD2 (64) are made two independent signals PD1RST and PD2RST respectively, in contrast to this two identical signals are supplied to both of said peak value detecting circuits PD1 and PD2. When the reset signals PD1RST and PD2RST change to high level, both switches 63a and 65a turn on and hold voltage reset to $V_{ref1}$ and $V_{ref2}$, respectively. That is, the switches 63a and 65a provide the same function as that of the MOS transistors 63 and 65 shown in FIG. 6.

The automatic threshold control circuit of the present invention is characterized in the method of supplying the reset signal to two peak value detecting circuits, that is, in the structure of the timing detecting circuit 110a. The practical structure of the timing detecting circuit 110 is described with reference to the attached drawings.

The timing circuit 110a shown in FIG. 2 corresponds to the timing detecting circuit 110, which is constituted by an EDGE detecting circuit system which generates the reset signal by detecting the edge of the input pulse signal. In FIG. 2, the same components as those in FIG. 1 are shown by the same reference number and explanations thereof are omitted.

The timing detecting circuit 110a is used for controlling reset signals PD1RST and PD2RST for respective peak detecting circuits PD1 (62) and PD2 (64), which constitute the feed-forward-type ATC circuit 100. The timing detecting circuit 100a comprises a limiting amplifier LIM, which receives two signals input into the input terminals ATCIN+ and ATCIN− as the positive phase input and the negative phase input, amplifies these input signals, and outputs the positive phase signal and the negative phase signal, upon restricting the output waveforms into a predetermined value; a differentiating circuit comprising a resistor R22 and a capacitor C22 for differentiating the positive phase and negative phase outputs of the limiting amplifier LIM; and a differentiating circuit comprising a resistor R21 and a capacitor C21; comparators COMP2 and COMP1 connected to the respective differentiating circuits; and RS flip-flop circuits RS-FF1 and RS-FF2 connected to respective negative outputs of the comparators COMP1 and COMP2 each having a hysteresis function.

In the above construction, the differentiating circuit comprising the resistor R22 and the capacitor C22, and the differentiating circuit comprising the resistor R21 and the capacitor C21 are both operated at the same ground potentials $V_0$, which is common to the limiting amplifier LIM. A threshold voltage $V_T$, which is lower than the ground potential $V_0$, is supplied to the negative phase inputs of the comparators COMP1 and COMP2. In the example shown in FIG. 2, it is designed such that the threshold voltage $V_T$ is supplied from the limiting amplifier LIM by applying the internal voltage of the limiting amplifier.

The comparators COMP1 and COMP2 operate as the rising and falling detectors of the input signals (the terminal signal ATCIN+), respectively. In the RS flip-flop circuits RS-FF1 and RS-FF2, the negative phase outputs of the comparators COMP1 and COMP2 are input into the reset input R, and the common reset signal RST1 is input into the set input S; and a reset signal PD1RST is output from the output Q of the RS flip-flop circuit RS-FF1 and a reset signal PD2RST is output from the output Q of the RS flip-flop circuit RS-FF2.

In the feed-forward circuit shown in FIG. 2, a standard voltage source Vref1, which is below the "0" level voltage of the minus input, is connected to the peak value detecting circuit PD1 (62), and a standard voltage source Vref2, which is below the "1" level of the plus input, is connected to the peak value detecting circuit PD2 (64), based on the initializing standard voltage source (not shown).

Figure 3:
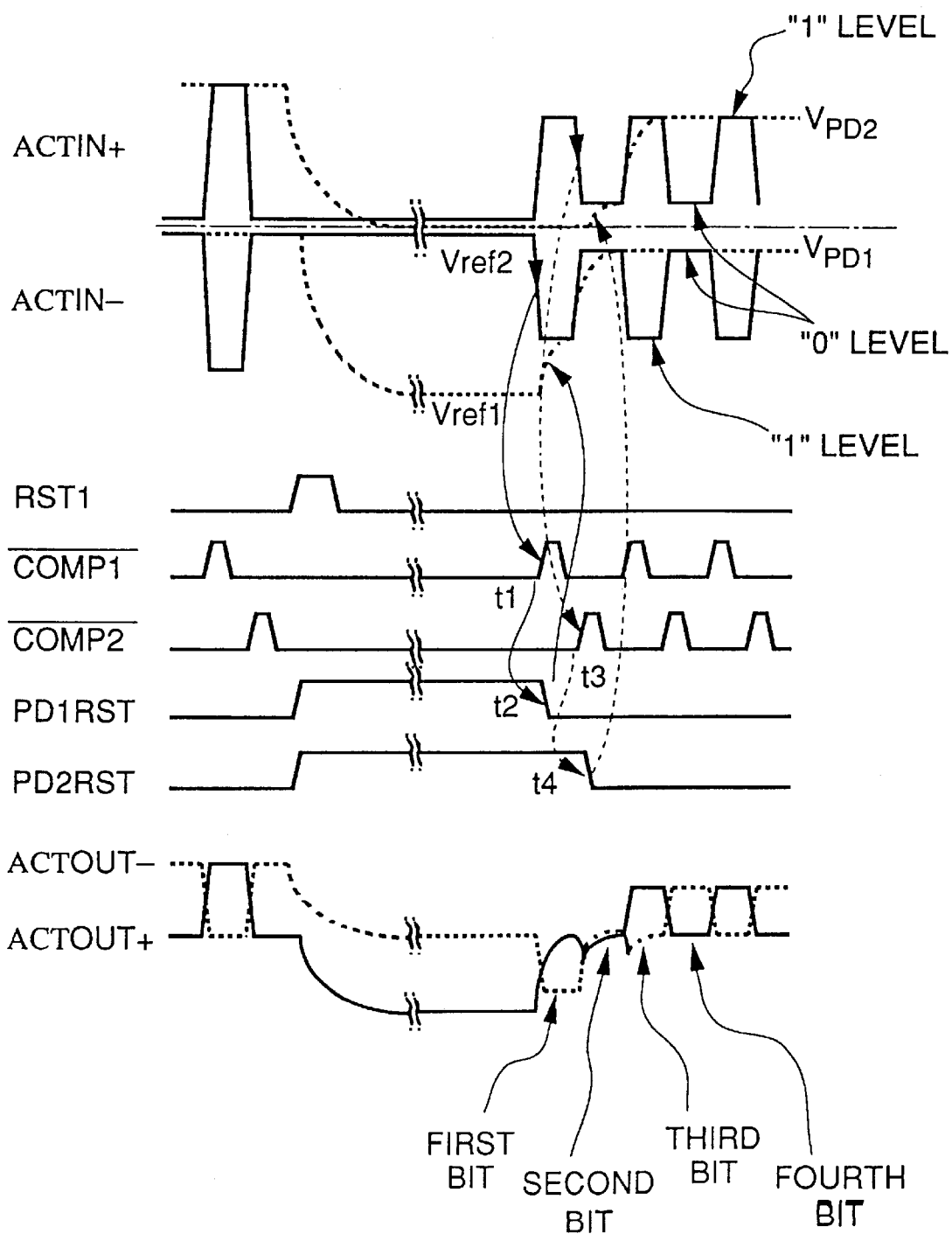
FIG. 3 is a timing chart showing operating waveforms of the circuit shown in FIG. 2.

The operation of the embodiment shown in FIG. 2 is described with reference to the timing diagram shown in FIG. 3. Due to the rise of the signal RST1, reset signals PD1RST and PD2RST are fixed at the high level, and the peak value detecting circuits PD1 (62) and PD2 (64) are both initialized at respective standard voltages Vref1 and Vref2 by the reset signals PD1RST and PD2RST fixed at the high level reset voltage. Even if the RST1 signal falls to a low level, the signals PD1RST and PD2RST are held as they are by the RS flip-flop circuits RS-FF1 and RS-FF2, and both peak value detecting circuits PD1 (62) and PD2 (64) are held at the initializing state.

The peak value detecting circuit PD2 (64), which receives an input signal input to the terminal ATCIN+, starts detecting the peak value of the input signal to the terminal ATCIN− and holds a "1" level at the third bit of the input signals to the terminal ACTIN− as the detected peak value, by resetting the RS flip-flop circuit at the time of the comparator COMP 2 for detecting the terminal ATCIN+ at the timing detecting circuit 110a, and by setting the signal PD2RST from the high level to the low level at the time t4.

On the other hand, the peak value detecting circuit PD1 (62), which receives an input signal input into the terminal ATCIN−, starts peak detection of the input signal to the terminal ATCIN− and holds the "0" level at the second bit of the input signals of the terminal ATCIN− as the detected peak value, by resetting the RS flip-flop circuit at the time t1 by the negative phase output of the comparator COMP 1 for detecting the fall of the input signal to the terminal ATCIN− in the timing detecting circuit 110a, and by setting the signal PD2RST from the high level to the low level at the time t2.

Consequently, the output voltages $V_{PD1}$ and $V_{PD2}$ of the peak detecting circuit PD1 (62) and PD2 (64) are controlled by the accurate threshold voltage, and waveforms without having any duty deterioration are output from output terminals ATCOUT+ and ATCOUT−.

As described above, according to the automatic threshold level control circuit shown in FIG. 2, it becomes possible to detect the accurate "0" level and to output a signal without having any DUTY deterioration by starting the detection by releasing the reset action by lowering the first bit of the minus input signal (ATCIN−) to the "1" level in the peak value detecting circuit PD1, and also by releasing the reset action by lowering the second bit of the plus input signal (ATCIN+) in the peak detection circuit PD2.

Figure 4:
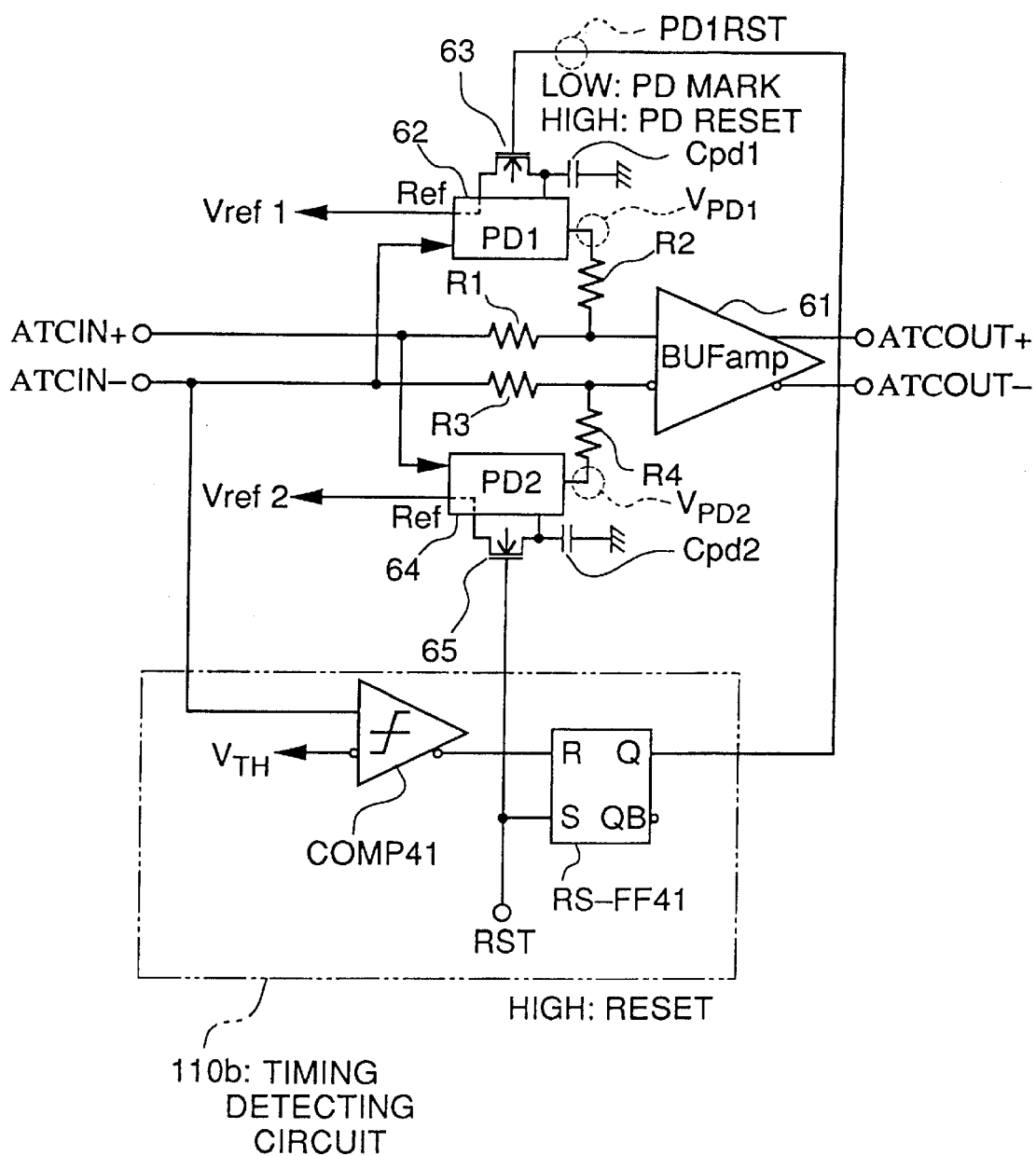
FIG. 4 is a circuit diagram showing the other practical structure of the automatic threshold level control circuit shown in FIG. 1.

The second embodiment of the present invention is described hereinafter with reference to FIGS. 4 and 5. In FIG. 4, the same components as those shown in FIG. 6 and FIGS. 1 and 2 are denoted by the same reference numerals. The automatic threshold level control circuit shown in FIG. 4 comprises a timing detecting circuit 110b composed of a comparator COMP 41 and a RS flip-flop circuit RS-FF41 instead of using the timing detection circuit 110a shown in FIG. 2. It is designed such that the peak value detecting circuit PD2 (64) is reset by the reset signal RST generated at the guard time of the burst signal similar to the conventional method, and the peak value detecting circuit PD1 (62) is reset by the Q output of the RS flip-flop circuit RS-FF41. This constitution allows the timing detecting circuit 110b shown in FIG. 4 to detect the timing by the level comparator circuit.

In the structure shown above, in the automatic threshold level control circuit shown in FIG. 4, since the peak value detecting circuit PD2 (64) is reset and the RS flip-flop circuit is set when the "high" level is input in the reset signal RST, the peak value detecting circuit PD1 (62) is also reset. The comparator COMP41 executes comparison between the input voltage to the terminal ATCIN− and an input voltage $V_{TH}$ to the negative phase input terminal, and the RS flip-flop circuit RS-FF41 is reset in response to the "high" level output from the negative phase output terminal output when the voltage at the terminal ATCIN− is smaller than the comparison voltage $V_{TH}$.

At this time, the peak value detecting circuit PD1 (62) is released from the reset state, and starts detecting the peak value of the "0" level input to the ATCIN+ terminal.

Figure 5:
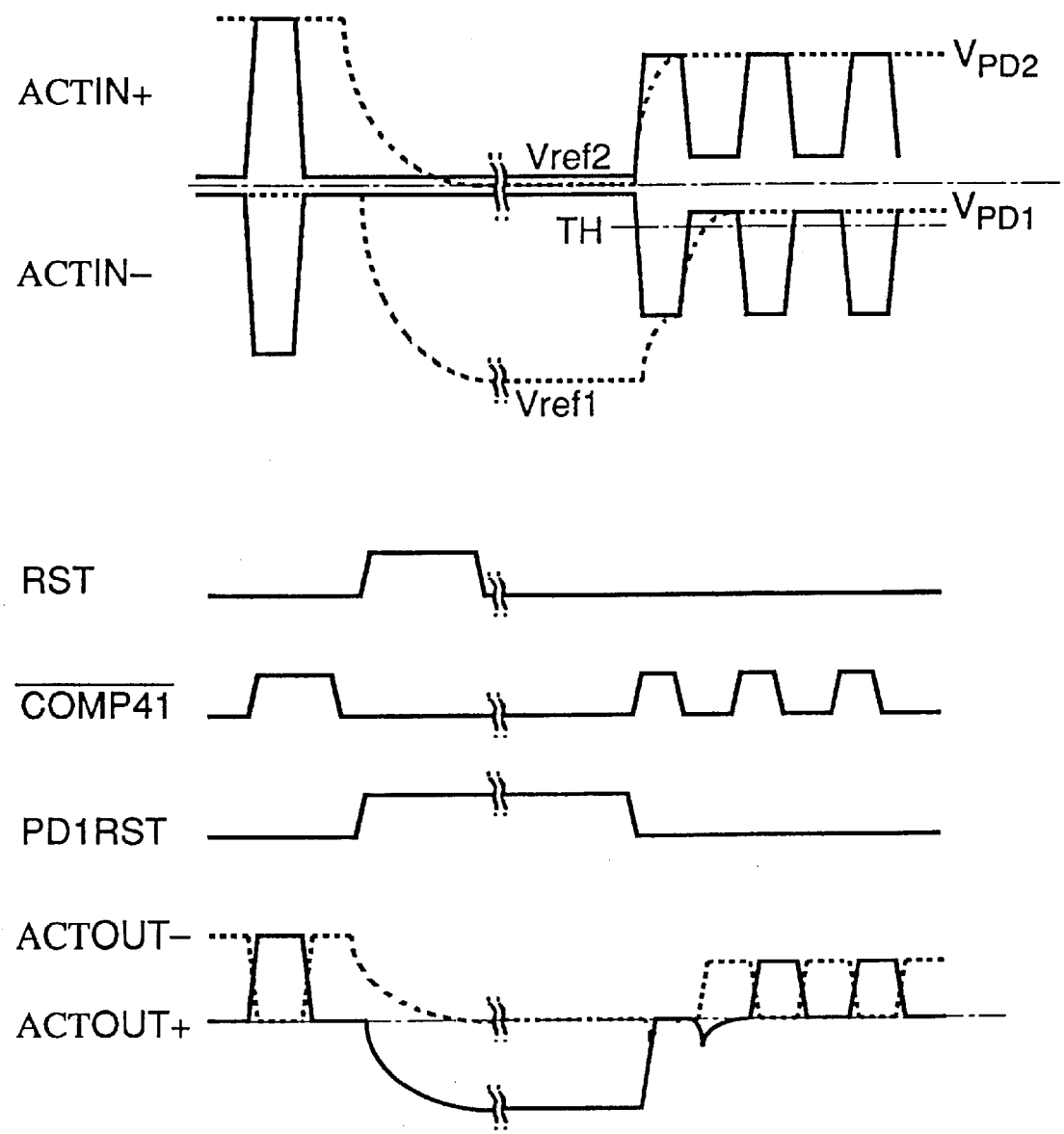
FIG. 5 is a timing chart showing operating waveforms of the circuit shown in FIG. 4.

As a result, output waveforms without DUTY deterioration are generated from ATCOUT− and ATCOUT+ as shown in FIG. 5, similar to the EDGE detecting circuit system.

As described above, the first effect of the present invention is that it is possible to output the signals without having any DUTY deterioration by carrying out an ideal feed-forward-type ATC circuit operation by accurately detecting the "1" level and "0" level, even when the "0" level of the input signal differs from the zero signal level.

The second effect of the present invention is that it is possible to improve the minimum light receiving sensitivity of the burst light receiving device required to provide high speed correspondence by executing automatic offset adjustment of the output signal by the automatic threshold level control circuit.

What is claimed is:

1. An automatic threshold level control circuit comprising:

a pair of peak value detecting circuits for preserving the peak voltage values of each input signals for input signals changing in the opposite phase to each other, for outputting the preserved voltage value as the standard for the threshold level of each input signal, and for resetting the preserving voltage value to the predetermined reference voltage value by a reset signal; and a timing detecting circuit for detecting a timing according to the change of the input signal and for outputting the reset signal for releasing the reset state corresponding to the detected timing to said peak value detecting circuit.

2. An automatic threshold level control circuit according to claim 1, wherein said timing detecting circuit outputs the reset signal for releasing the reset state in response to the timing when the input signal level changes.

3. An automatic threshold level control circuit according to claim 1, wherein said timing detecting circuit output a pair of reset signals for releasing the reset state to each peak value detecting circuit independently in response to the edge change of each input signal.

4. An automatic threshold level control circuit according to claim 1, wherein said timing detecting circuit comprises a comparator which operates by inputting an input signal and at least a pair of RS flip-flop circuits which operates according to the output of the comparator, and said timing detecting circuit detects a predetermined timing in response to the change of the input signal, temporary holds the reset signal to be output by the RS flip-flop circuit, and releases the reset state by the output of the comparator.

* * * * *